US008963064B2

(12) United States Patent
Yonekura et al.

(10) Patent No.: US 8,963,064 B2
(45) Date of Patent: Feb. 24, 2015

(54) PHOTOSENSOR HAVING UPPER AND LOWER ELECTRODES WITH AMORPHOUS SILICON FILM AND N-TYPE AMORPHOUS SILICON FILM THEREBETWEEN AND PHOTOSENSOR ARRAY

(75) Inventors: Takeshi Yonekura, Chiba (JP); Toshio Miyazawa, Chiba (JP); Atsushi Hasegawa, Togane (JP); Terunori Saitou, Mobara (JP); Kozo Yasuda, Mobara (JP)

(73) Assignees: Japan Display Inc., Tokyo (JP); Panasonic Liquid Crystal Display Co., Ltd., Himeji-shi (JP)

( * ) Notice: Subject to any disclaimer, the term of this patent is extended or adjusted under 35 U.S.C. 154(b) by 444 days.

(21) Appl. No.: 13/239,754

(22) Filed: Sep. 22, 2011

(65) Prior Publication Data

US 2012/0074297 A1  Mar. 29, 2012

(30) Foreign Application Priority Data

Sep. 28, 2010  (JP) .................................. 2010-216708

(51) Int. Cl.
*H01L 27/00*  (2006.01)
*H01L 27/146*  (2006.01)
*H01L 31/08*  (2006.01)
*H01L 31/103*  (2006.01)

(52) U.S. Cl.
CPC ...... *H01L 27/14649* (2013.01); *H01L 27/1461* (2013.01); *H01L 31/08* (2013.01); *H01L 31/103* (2013.01)
USPC .................. 250/208.1; 250/214.1; 250/208.2; 348/297; 257/437

(58) Field of Classification Search
USPC ...... 250/214.1, 214 R, 208.1, 208.2, 214 DC; 257/431; 348/281, 282, 283, 294, 297, 348/299, 300, 301
See application file for complete search history.

(56) References Cited

U.S. PATENT DOCUMENTS

| 5,023,443 | A | * | 6/1991 | Komatsu et al. | ............ 250/208.1 |
| 2006/0113484 | A1 | * | 6/2006 | Endo | ......................... 250/370.11 |
| 2011/0006192 | A1 | | 1/2011 | Miyazawa et al. | |

FOREIGN PATENT DOCUMENTS

| CN | 1890957 | 1/2007 |
| JP | 11-097660 | 4/1999 |

(Continued)

OTHER PUBLICATIONS

English translation of Chinese Patent Office Action in Chinese Patent Application No. 201110294301.6, dated Apr. 2, 2014.

(Continued)

*Primary Examiner* — Francis M Legasse, Jr.
(74) *Attorney, Agent, or Firm* — Antonelli, Terry, Stout & Kraus, LLP.

(57) ABSTRACT

A photosensor array includes plural photosensor pixels. Each of the photosensor pixels includes a lower electrode, an amorphous silicon film, an n-type amorphous silicon film, and an upper electrode. The photosensor array includes plural scanning lines connected to the upper electrodes, plural read lines connected to the lower electrodes, a scanning circuit that is connected to the plural scanning lines, and sequentially supplies a selection scanning signal of a first voltage to the respective scanning lines, a first unit that inputs a second voltage higher than the first voltage to the plural read lines in a blanking period of one horizontal scanning period, and thereafter puts the plural read lines into the floating state, and a second unit that outputs a voltage change in each of the read lines within one horizontal scanning period as the sensor output voltage of the photosensor pixel.

12 Claims, 12 Drawing Sheets

(56) References Cited

FOREIGN PATENT DOCUMENTS

| | | |
|---|---|---|
| JP | 2010-011033 | 1/2010 |
| JP | 2011-019102 | 1/2011 |

OTHER PUBLICATIONS

English translation of Office Action in corresponding Japanese Patent Application No. 2010-216708, dated Feb. 4, 2014.

* cited by examiner

PHOTOSENSOR HAVING UPPER AND LOWER ELECTRODES WITH AMORPHOUS SILICON FILM AND N-TYPE AMORPHOUS SILICON FILM THEREBETWEEN AND PHOTOSENSOR ARRAY

CROSS-REFERENCE TO RELATED APPLICATION

The present application claims priority from Japanese application JP2010-216708 filed on Sep. 28, 2010, the content of which is hereby incorporated by reference into this application.

BACKGROUND OF THE INVENTION

1. Field of the Invention

The present invention relates to a photosensor and a photosensor array, and more particularly to a photosensor array using a thick amorphous silicon film which is a light-dependent variable resistor element, as a photosensor element.

2. Description of the Related Art

Ones of the present inventors have filed Japanese Patent Application entitled photosensor using an amorphous silicon (a-Si) film and photosensor array as a photosensor element (Japanese Patent Application No. 2009-162612). The amorphous silicon (a-Si) film of the photosensor in the invention disclosed in the filed Japanese Patent Application operates as the light-dependent variable resistance element in which a resistance is varied in response to an incident light.

FIG. 13 is a circuit diagram illustrating a circuit configuration of a photosensor array in the invention disclosed in the filed Japanese Patent Application.

In the photosensor array according to the invention disclosed in the filed Japanese Patent Application, a dashed frame A of FIG. 13 represents a photosensor pixel. The photosensor pixel includes three transistors MT1 to MT3, a light-dependent variable resistance element AS1, a capacitive element (storage capacitor) C1, a gate line GCLK for conducting read reset, a reset line SVRS that applies a reset voltage VRS, bias lines SVB1, SVB2, SVAB, that apply bias voltages (fixed potential) VB1,VB2,VAB respectively and a signal output line OUT.

FIG. 13 illustrates a photosensor array in which the number of photosensor pixels is m×K. FIG. 13 illustrates a specific circuit diagram of the photosensor having four pixels of n to (n+1) rows and J to (J+1) columns.

At a lower side of the periphery of the photosensor array, reset transistors MTR each for resetting a voltage at a signal output line OUT, a reset line SVRST for applying a reset voltage VRST, and a terminal that inputs a control voltage RSTPLS for controlling output bonding pads PAD and the reset transistors MTR are arranged. A shift register 12 is disposed at a left side of the periphery of the photosensor array.

FIG. 14 is a diagram illustrating a configuration of the light-dependent variable resistance element AS1 illustrated in FIG. 13. The light-dependent variable resistance element AS1 illustrated in FIG. 14 includes an upper electrode 92, a lower electrode 94, and amorphous silicon (a-Si) 93 held between the upper electrode and the lower electrode 94. FIG. 14 illustrates the light-dependent variable resistance element AS1 and the capacitive element C1. FIG. 15 illustrates an equivalent circuit of the light-dependent variable resistance element AS1 illustrated in FIG. 14.

FIG. 16 is a timing chart illustrating the operation of the photosensor array illustrated in FIG. 13. Hereinafter, the operation of the photosensor pixel indicated in the dashed frame A in FIG. 13 will be described with reference to FIG. 16.

For facilitation of description, it is assumed that bias voltages are VB1=VB2=0V (GND), VAB=10V, and the reset voltages are VRS=5V, and VRST=0V. Also, the voltages of respective clocks ($\phi1$, $\phi2$) are 10V in high level (hereinafter, referred to as H level) or 0V in low level (hereinafter, referred to as L level). The voltage values of the respective bias voltages are exemplary, and may be voltages other than the above-described values. Also, the bias voltage VAB may be a voltage of the reset voltage VRS or higher.

Referring to FIG. 13, the respective rows of the photosensor pixels are sequentially scanned downward in FIG. 13 by the shift register 12. That is, referring to FIG. 13, the gate lines GCLK are sequentially applied with on-voltage pulses in the increasing order of number.

First, when a voltage of 10V which is H level is applied to a gate line GCLK (n+1) by the shift register 12, the transistor MT1 turns on in the photosensor pixel, and an internal node N1 of the photosensor pixel is electrically rendered conductive to the bias line SVRS, and a voltage at the internal node N1 becomes 5V that is the same potential as that of the bias voltage VRS.

Subsequently, when a voltage that is applied to the gate line GCLK (n+1) becomes a voltage of 0V which is L level, the internal node N1 of the photosensor pixel becomes an electrically isolated node, but a voltage at the internal node N1 is held by the capacitive element C1 between the bias line SVB2 and the node N1.

In this state, the internal node N1 is connected to the bias line SVB1 applied with the bias potential VB1 of 0V. For example, a resistance value of the light-dependent variable resistance element AS1 is set to a value at which a dark current of about several tens fA flows at a room temperature.

When the light-dependent variable resistance element AS1 is irradiated with light (infrared rays), a resistance is decreased by carrier pairs generated in semiconductor by photoelectric conversion. The light is detected by the aid of this phenomenon. The photosensor for an environmental purpose is designed, for example, so that a current of a few pA flows in the light-dependent variable resistance element AS1.

In this way, electric charges stored in the internal node N1 are discharged to the bias line SVB2 through the light-dependent variable resistance element AS1. The amount of discharged electric charges fluctuates due to the resistance of the light-dependent variable resistance element AS1 in the dark state, and the amount of incident light. Accordingly, the voltage at the node N1 after a given time has been elapsed is different according to the amount of incident light.

A storage time of an optical signal due to the incident light is from the time when a voltage of 0V that is L level is applied to the gate line GCLK(n+1) by the shift register 12 until the gate line scanning by the shift register 12 substantially goes round (after one frame) and then a voltage of 10V that is H level is applied to the gate line GCLK(n).

At a time t2, when the control voltage RSTPLS becomes, for example, a voltage of 10V that is H level, the reset transistor MTR illustrated in FIG. 13 becomes on, and a signal output line OUT(j) is reset to the reset voltage VRST of 0V.

At a time t3, when the control voltage RSTPLS becomes 0V (L level), the signal output line OUT(j) becomes in a floating state.

At a time t4, when a voltage of 10V that is H level is applied to the gate line GCLK (n), the transistor MT3 turns on, and the output line OUT(j) and the bias line SVAB are connected to each other through the transistor MT2 and the transistor MT3.

A gate voltage of the transistor MT3 is 10V, and the transistor MT3 operates in an unsaturated state, but the transistor MT2 operates in a saturated state. This is because a gate of the transistor MT2 is the internal node N1, and becomes 5V or lower in response to the amount of incident light as described above.

Accordingly, the transistor MT2 is cut off by a source voltage (V3) corresponding to the gate voltage. For that reason, a voltage at the output line OUT(1) becomes a value corresponding to the voltage at the internal node N1, as a result of which an output voltage corresponding to the amount of incident light is obtained.

At a time t5, when a voltage of 0V which is L level is applied to the gate line GCLK(n), the transistor MT3 turns off.

At a time t8, when a voltage of 10V that is H level is applied to the gate line GCLK(n+1), the transistor MT1 turns on, and the internal node N1 is reset to the bias voltage VRS of 5V.

The above operation is repeated in each of the pixels.

SUMMARY OF THE INVENTION

A system in which the above-described photosensor array illustrated in FIG. 13 detects light in the photosensor pixel at an n-th row is configured as follows. When the gate line GCLK(n+1) is H level, the transistor MT1 turns on, and the capacitive element C1 is charged. Also, when the gate line GCLK(n+1) is L level, the transistor MT1 turns on, and electric charge accumulated in the capacitive element C1 is discharged by the incident light. Then, when the gate line GCLK(n) is H level, the electric charge accumulated in the capacitive element C1 after the capacitive element C1 has been discharged by the incident light is directly read.

In this way, in the above-described related-art photosensor array illustrated in FIGS. 13 to 16, there is a need to provide the signal read switching transistor MT1 for reading the electric charge accumulated in the capacitive element C1. For that reason, there is a need to provide a process of forming a thin-film transistor in which a semiconductor layer is formed of an amorphous silicon layer or a polysilicon layer on a photosensor array substrate such as a glass substrate. As a result, there arises such a problem that the respective pixel structures of the photosensor array are complicated, and the cost of the photosensor array increases.

The present invention has been made to solve the above problem with the related art, and therefore an object of the present invention is to provide a technology in which the pixel structure can be simplified with no need to provide a signal read switching transistor.

The above and other objects and new features of the present invention will become apparent from the description of the present application and the accompanying drawings.

A typical outline of the invention disclosed in the present application will be briefly described as follows.

(1) The photosensor includes a lower electrode formed of a metal film; an amorphous silicon film disposed on the lower electrode; an n-type amorphous silicon film disposed on the amorphous silicon film; and an upper electrode disposed on the n-type amorphous silicon film. The photosensor outputs a voltage depending on the amount of light input to the amorphous silicon film as a sensor output voltage. The photosensor includes a unit that inputs a first voltage to the upper electrode; a switch circuit that inputs a second voltage higher in potential than the first voltage to the lower electrode in an on-state, and puts the lower electrode into a floating state in an off-state; and a detector circuit that outputs a voltage change of the lower electrode after a given period has been elapsed, as the sensor output voltage, when the lower electrode is in the floating state.

(2) The photosensor includes a lower electrode formed of a metal film; an amorphous silicon film disposed on the lower electrode; an n-type amorphous silicon film disposed on the amorphous silicon film; and an upper electrode disposed on the n-type amorphous silicon film. The photosensor outputs a voltage depending on the amount of light input to the amorphous silicon film as a sensor output voltage. The photosensor includes a unit that inputs a first voltage to the lower electrode; a switch circuit that inputs a second voltage lower in potential than the first voltage to the upper electrode in an on-state, and puts the upper electrode into a floating state in an off-state; and a detector circuit that outputs a voltage change of the upper electrode after a given period has been elapsed, as the sensor output voltage, when the upper electrode is in the floating state.

(3) The photosensor array includes (m×n) photosensor pixels arranged in an array. Each of the photosensor pixels includes a lower electrode formed of a metal film; an amorphous silicon film disposed on the lower electrode; an n-type amorphous silicon film disposed on the amorphous silicon film; and an upper electrode disposed on the n-type amorphous silicon film. Each of the photosensor pixels outputs a voltage corresponding to the amount of light input to the amorphous silicon film as a sensor output voltage. The photosensor array includes plural scanning lines connected to the upper electrodes included in the photosensor pixels on each row; plural read lines connected to the lower electrodes included in the photosensor pixels on each column; a scanning circuit that is connected to the plural scanning lines, and sequentially supplies a selection scanning signal of a first voltage to the respective scanning lines every one horizontal scanning period; a first unit that inputs a second voltage higher in potential than the first voltage to the plural read lines in a blanking period of one horizontal scanning period, and thereafter puts the plural read lines into the floating state; and a second unit that is connected to the plural read lines, and outputs a voltage change in each of the read lines within one horizontal scanning period as the sensor output voltage of the photosensor pixel having the lower electrode connected to each of the read lines and the upper electrode receiving the selection scanning voltage.

(4) The photosensor array includes (m×n) photosensor pixels and (m×1) compensation photosensor pixels arranged in an array. Each of the photosensor pixels includes a lower electrode formed of a metal film; an amorphous silicon film disposed on the lower electrode; an n-type amorphous silicon film disposed on the amorphous silicon film; and an upper electrode disposed on the n-type amorphous silicon film. Each of the compensation photosensor pixels includes a lower electrode formed of a metal film; an amorphous silicon film that is disposed on the lower electrode, and blocked from light; an n-type amorphous silicon film disposed on the amorphous silicon film; and an upper electrode disposed on the n-type amorphous silicon film. Each of the photosensor pixels outputs a voltage corresponding to the amount of light input to the amorphous silicon film as a sensor output voltage. The photosensor array includes plural scanning lines connected to the upper electrodes of the photosensor pixels and the compensation photosensor pixel on each row; plural read lines connected to the lower electrodes of the photosensor pixels on each column; a compensation pixel read line connected to the lower electrodes of the compensation photosensor pixels on the one column; a scanning circuit that is connected to the plural scanning lines, and sequentially supplies a selection scanning signal of a first voltage to the respective scanning lines every one horizontal scanning period; a first unit that inputs a second voltage higher in potential than the first voltage to the plural read lines and the compensation pixel read line in a blanking period of one horizontal scanning period, and thereafter puts the plural read lines and the compensation pixel read line into the floating state; a second unit that is connected to the plural read lines, and outputs a voltage change in each of the read lines within one horizontal scanning period as the sensor output voltage of the photosensor pixel having the lower electrode connected to each of the read lines and the upper electrode receiving the selection scanning voltage; and a third unit that is connected to the compensation pixel read line, and outputs a voltage change in the compensation pixel read line within the horizontal scanning period as a compensation signal voltage of the compensation photosensor pixel having the upper electrode receiving the selection scanning voltage.

(5) The photosensor array includes (m×n) photosensor pixels arranged in an array. Each of the photosensor pixels includes a lower electrode formed of a metal film; an amorphous silicon film disposed on the lower electrode; an n-type amorphous silicon film disposed on the amorphous silicon film; and an upper electrode disposed on the n-type amorphous silicon film. Each of the photosensor pixels outputs a voltage corresponding to the amount of light input to the amorphous silicon film as a sensor output voltage. The photosensor array includes plural scanning lines connected to the lower electrodes of the photosensor pixels on each row; plural read lines connected to the upper electrodes of the photosensor pixels on each column; a scanning circuit that is connected to the plural scanning lines, and sequentially supplies a selection scanning signal of a first voltage to the respective scanning lines every one horizontal scanning period; a first unit that inputs a second voltage lower in potential than the first voltage to the plural read lines in a blanking period of one horizontal scanning period, and thereafter puts the plural read lines into the floating state; and a second unit that is connected to the plural read lines, and outputs a voltage change in each of the read lines within one horizontal scanning period as the sensor output voltage of the photosensor pixel having the upper electrode connected to each of the read lines and the lower electrode receiving the selection scanning voltage.

(6) The photosensor array includes (m×n) photosensor pixels and (m×1) compensation photosensor pixels arranged in an array. Each of the photosensor pixels includes a lower electrode formed of a metal film; an amorphous silicon film disposed on the lower electrode; an n-type amorphous silicon film disposed on the amorphous silicon film; and an upper electrode disposed on the n-type amorphous silicon film. Each of the compensation photosensor pixels includes a lower electrode formed of a metal film; an amorphous silicon film that is disposed on the lower electrode, and blocked from light; an n-type amorphous silicon film disposed on the amorphous silicon film; and an upper electrode disposed on the n-type amorphous silicon film. Each of the photosensor pixels outputs a voltage corresponding to the amount of light input to the amorphous silicon film as a sensor output voltage. The photosensor array includes plural scanning lines connected to the lower electrodes of the photosensor pixels and the compensation photosensor pixel on each row; plural read lines connected to the upper electrodes of the photosensor pixels on each column; a compensation pixel read line connected to the upper electrodes of the compensation photosensor pixels on the one column; a scanning circuit that is connected to the plural scanning lines, and sequentially supplies a selection scanning signal of a first voltage to the respective scanning lines every one horizontal scanning period; a first unit that inputs a second voltage lower in potential than the first voltage to the plural read lines and the compensation pixel read line in a blanking period of one horizontal scanning period, and thereafter puts the plural read lines and the compensation pixel read line into the floating state; a second unit that is connected to the plural read lines, and outputs a voltage change in each of the read lines within one horizontal scanning period as the sensor output voltage of the photosensor pixel having the upper electrode connected to each of the read lines and the lower electrode receiving the selection scanning voltage; and a third unit that is connected to the compensation pixel read line, and outputs a voltage change in the compensation pixel read line within the horizontal scanning period as a compensation signal voltage of the compensation photosensor pixel having the lower electrode receiving the selection scanning voltage.

(7) In (4) or (6), there is provided a signal processing circuit that receives the respective sensor output voltages, and the compensation signal voltages. The signal processing circuit includes an A/D converter that subjects the respective sensor output voltages and the compensation signal voltage to A/D conversion, and a subtractor that subtracts a digital signal of the compensation signal voltage converted by the A/D converter from a digital value of the respective sensor output voltages converted by the A/D converter.

(8) In any one of (3) to (7), the first unit includes plural switching transistors disposed for each of the plural read lines and the compensation pixel read line, and the plural switching transistors are on within a blanking period of the one horizontal scanning period so as to input the second voltage to the plural read lines and the compensation pixel read line.

(9) In any one of (1) to (8), a thickness of the amorphous silicon films of the respective photosensor pixels ranges from 500 nm to 1200 nm.

The advantages obtained by the typical configuration of the invention disclosed in the present application will be described in brief as follows.

According to the present invention, in the photosensor and the photosensor array, the pixel structure can be simplified with no need to provide the signal read switching transistor.

DETAILED DESCRIPTION OF THE INVENTION

Figure 1:
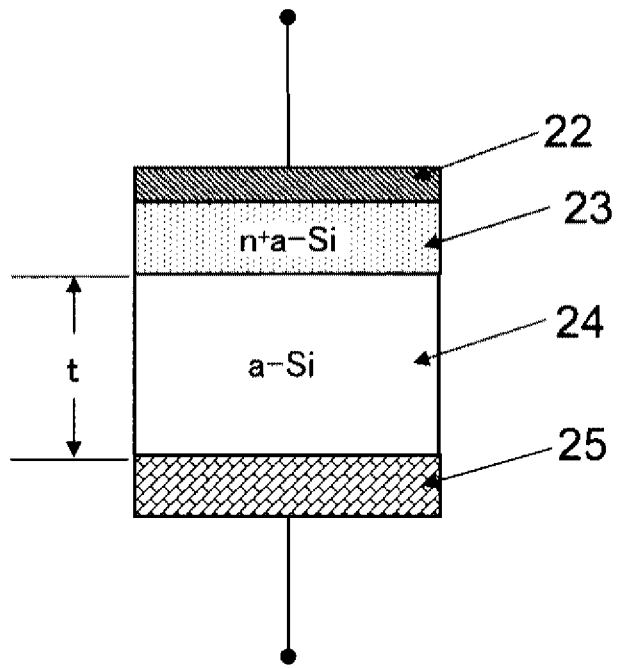
FIG. 1 is a cross-sectional view illustrating a cross-section structure of a photosensor used in a photosensor array according to a first embodiment.

Hereinafter, the embodiments of the present invention will be described in detail with reference to the accompanying drawings.

Note that parts having the same functions In all drawings for illustrating the embodiments will be denoted by identical reference numerals, and their repetitive description will be omitted. Also, the following embodiments do not limit the interpretation of claims of the present invention.

[First Embodiment]

In the multiple embodiments of the present invention to be described below, an amorphous silicon film (a-Si) and an n-type amorphous silicon film (n+a-Si) doped with phosphorus are used as a photosensor element.

FIG. 1 is a cross-sectional view illustrating a cross-section structure of a photosensor for one pixel used in a photosensor array according to a first embodiment of the present invention. As illustrated in FIG. 1, a photosensor according to this embodiment includes a lower electrode 25, an amorphous silicon film (a-Si) 24 that is stacked on the lower electrode 25, an n-type amorphous silicon film (n+a-Si) 23 that is stacked on the amorphous silicon film (a-Si) 24 and doped with phosphorus, and an upper electrode 22 disposed on the n-type amorphous silicon film (n+a-Si) 23 doped with phosphorus.

That is, in this embodiment, the n-type amorphous silicon film (n+a-Si) 23 doped with phosphorus and the amorphous silicon film (a-Si) 24 are held between the upper electrode 22 and the lower electrode 25.

In this example, it is preferable that the material of the upper electrode 22 and the lower electrode 25 is so selected as to make an ohmic connection with the amorphous silicon film (a-Si) 24 and the n-type amorphous silicon film (n+a-Si) 23 doped with phosphorus, respectively, or make an ohmic connection in a forward bias direction that will be described later. Also, because this configuration is used as the photosensor, there is a need to select the electrode on a light incident side which transmits a light of a desired wavelength. As one example, the upper electrode 22 is made of ITO (indium tin oxide), and the lower electrode 25 is made of MoW/Al—Si/MoW. The same is applied to a cross-section structure of the photosensor according to other embodiments which will be described below.

Figure 2:
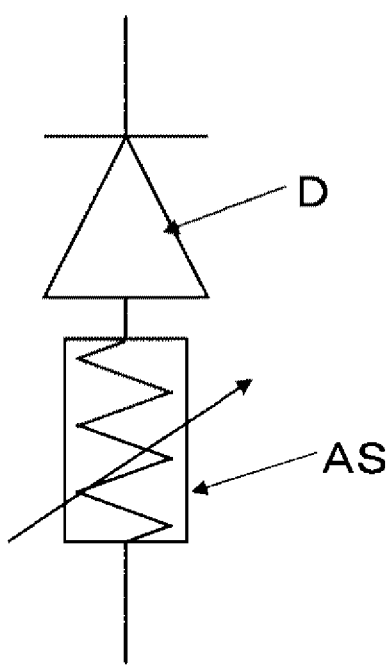
FIG. 2 is a circuit diagram illustrating an equivalent circuit of the photosensor illustrated in FIG. 1.

FIG. 2 is a circuit diagram illustrating an equivalent circuit of the photosensor illustrated in FIG. 1.

The n-type amorphous silicon film (n+a-Si) 23 doped with phosphorus is an n-type semiconductor higher in impurity concentration than the amorphous silicon film (a-Si) 24. Therefore, a junction plane of the n-type amorphous silicon film (n+a-Si) 23 doped with phosphorus and the amorphous silicon film (a-Si) 24 exhibits a diode characteristic having an anode at the amorphous silicon film (a-Si) 24 side and a cathode at the n-type amorphous silicon film (n+a-Si) 23 side.

Also, when a light is input to the amorphous silicon film (a-Si), electrons are excited to produce electron-hole pairs, and conduction carriers increase to increase a current. That is, the amorphous silicon film (a-Si) forms a variable resistance that is changed according to light. This is a phenomenon called photoconduction.

In order to put the photosensor using this photoconduction into practical use, a thickness t of the amorphous silicon film (a-Si) 24 is an important factor.

Figure 3:
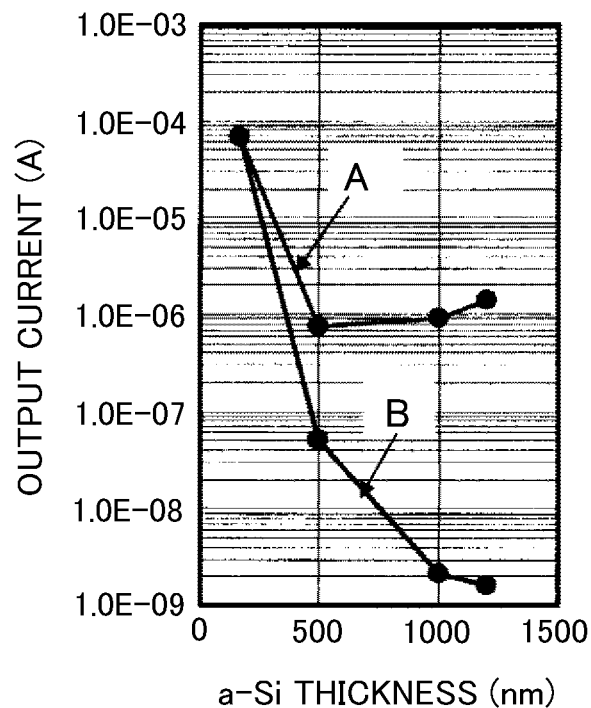
FIG. 3 is a graph illustrating an example of a relationship between a thickness and photoconduction of an amorphous silicon film.

FIG. 3 is a graph illustrating one example of a relationship between the thickness t and the photoconduction of the amorphous silicon film (a-Si) 24. Referring to FIG. 3, symbol A represents a relationship between the thickness t and the photoconduction of the amorphous silicon film (a-Si) when the amorphous silicon film (a-Si) is irradiated with light, and B represents a relationship between the thickness t and the photoconduction of the amorphous silicon film (a-Si) when the amorphous silicon film (a-Si) is not irradiated with light.

As illustrated in FIG. 3, when the thickness of the amorphous silicon film (a-Si) is as thin as 170 nm, the resistance of the amorphous silicon film (a-Si) is low, and a current (bias current or dark current) that flows in a state where the amorphous silicon film (a-Si) is not irradiated with light, that is, in a dark state is large. Therefore, a current increase attributable to a change in resistance caused by the photoconduction at the time of light irradiation is buried in the bias current, and cannot be observed (separated).

On the other hand, when the thickness of the amorphous silicon film (a-Si) is thickened to 500 nm, 1000 nm, and 1200 nm, a resistance in the thickness direction (distance between those electrodes) becomes larger, and the bias current is decreased. For that reason, as illustrated in FIG. 3, a difference occurs between the current increase attributable to the change in resistance caused by the photoconduction at the time of light irradiation, and the bias current. This difference depends on the amount of light. This structure can be used as the photosensor by measurement of this difference.

Figure 4:
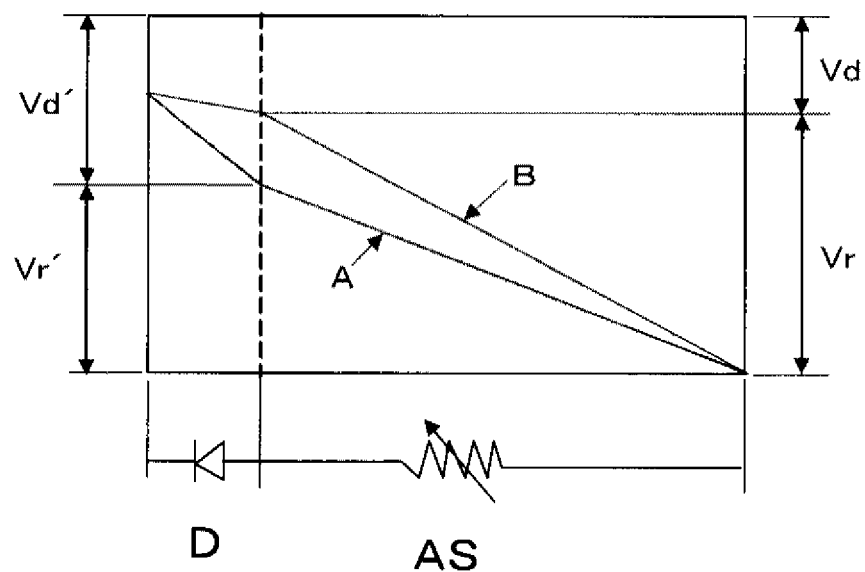
FIG. 4 is a diagram illustrating the operation of the photosensor according to the first embodiment.

FIG. 4 is a diagram illustrating voltages applied to a diode part D and a light-dependent variable resistance part AS of the photosensor in the amorphous silicon film (a-Si). It is assumed that the voltages applied to the diode part D and the light-dependent variable resistance part AS in a state where the bias current of the dark state flows in the photosensor are Vd and Vr, respectively. In this example, it is assumed that Vd+Vr are constant (VD). In this state, when the amorphous silicon film (a-Si) is irradiated with light, a resistance value of the light-dependent variable resistance part AS of the amorphous silicon film (a-Si) becomes low due to the photoconduction, Vr is decreased, and Vd is increased, thereby increasing the forward voltage applied to the diode.

Figure 5:
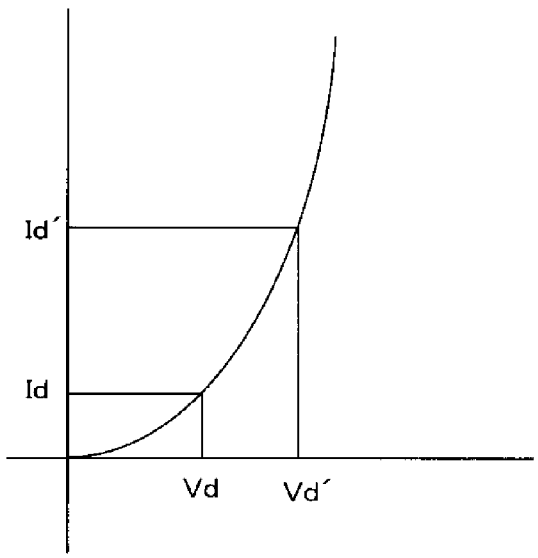
FIG. 5 is a graph illustrating a current to voltage characteristic of a general diode.

FIG. 5 illustrates a current to voltage characteristic of a general diode. According to the current to voltage characteristic, increase in the forward voltage precipitously increases a current with respect to the voltage change. The current increase is equivalent to that conduction carriers are implanted into the light-dependent variable resistance part AS of the amorphous silicon film (a-Si). Therefore, the effective resistance of the light-dependent variable resistance part AS of the amorphous silicon film (a-Si) is further decreased.

Finally, a current flows, which maintains balance among the diffused carriers in the diode due to an increase Vd of the forward voltage applied to the diode part D, the resistance value of the light-dependent variable resistance part AS of the amorphous silicon film (a-Si) that has been low in resistance, and a divided voltage Vr determined according to a flowing current.

In this way, the n-type amorphous silicon film (n+a-Si) doped with phosphorus is stacked on the amorphous silicon film (a-Si), thereby being capable of obtaining a photocurrent amplified by the diode configured by the n-type amorphous silicon film (n+a-Si) doped with phosphorus and the amorphous silicon film (a-Si).

According to the experiments, a structure in which the n-type amorphous silicon film (n+a-Si) doped with phosphorus is stacked on the amorphous silicon film (a-Si) has a current amplifying effect which is about 10000 times as large as that in a structure having only the amorphous silicon film (a-Si).

Hereinafter, the photosensor array according to this embodiment will be described with reference to FIGS. 6 to 8.

Figure 6:
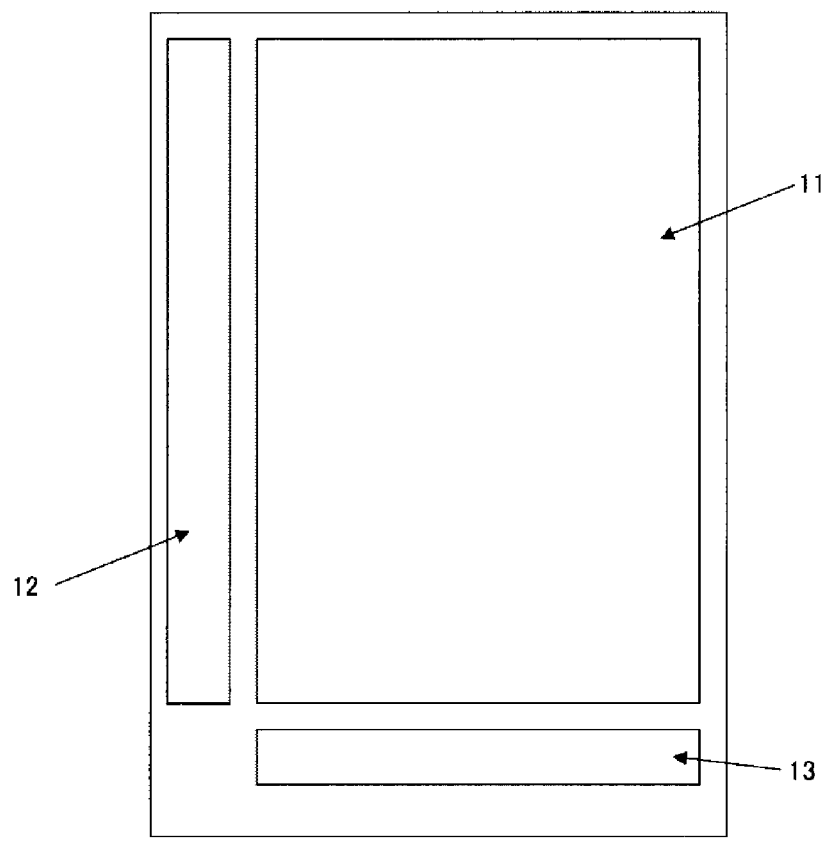
FIG. 6 is a block diagram illustrating a structure of a photosensor array according to the first embodiment.

FIG. 6 is a block diagram illustrating a structure of a photosensor array according to the first embodiment. The same is applied to the configuration of the photosensor array according to other embodiments described below.

In the photosensor array according to this embodiment, a photosensor array part 11 is disposed in the center of the photosensor array, a shift register 12 that sequentially supplies read pulses for reading the detection results of the photosensor pixels is disposed at a left side of the periphery of the photosensor array part 11, and a bonding pad part 13 that connects to the external is disposed at a lower side of the periphery of the photosensor array part 11.

In this case, the photosensor array part 11 is configured by, for example, the photosensors of 100×150 which are arranged in a matrix. The respective photosensor pixels of the photosensor array part 11 are the photosensors illustrated in FIG. 1.

Figure 7:
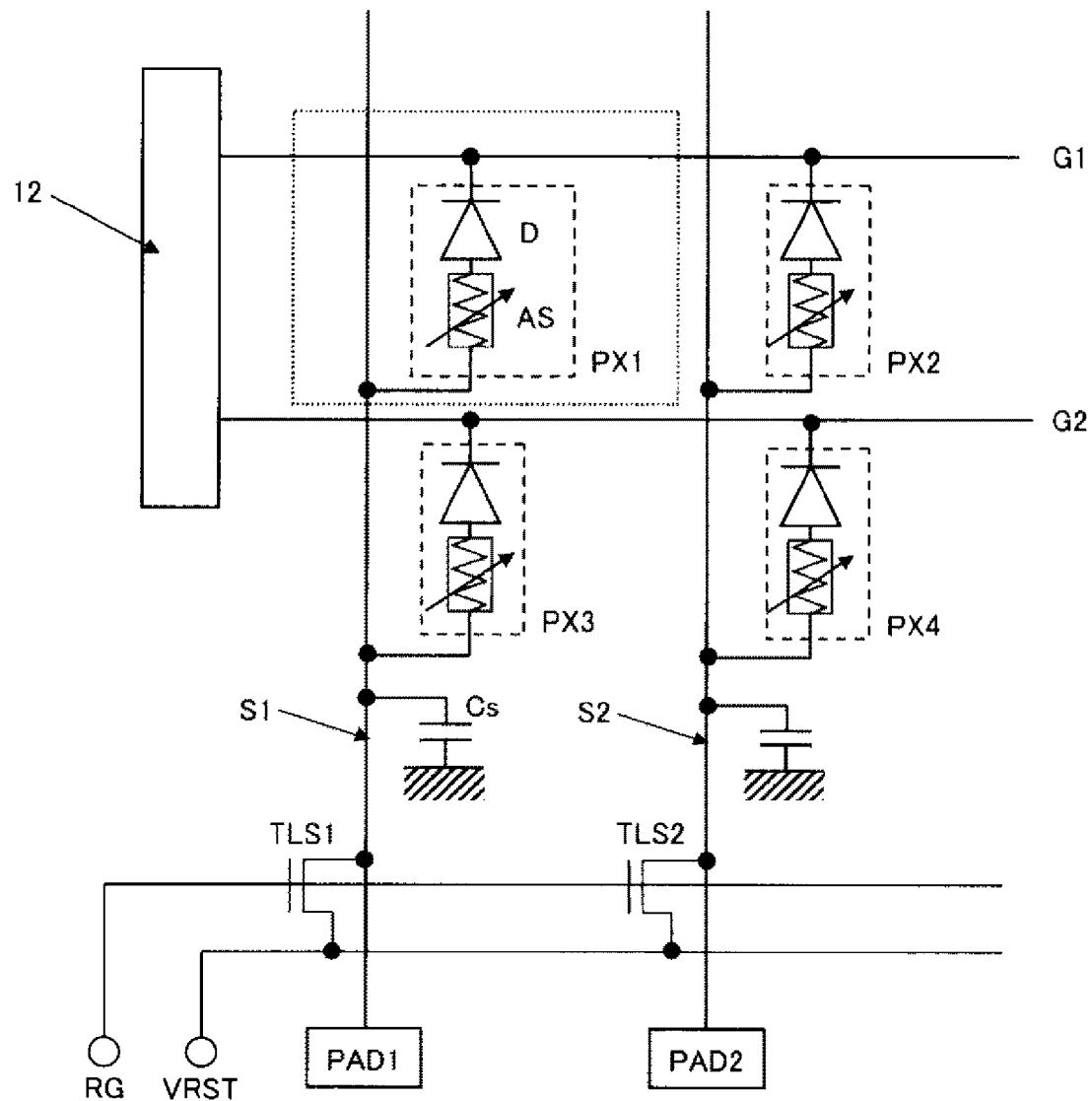
FIG. 7 is a circuit diagram illustrating a circuit configuration of the photosensor array according to the first embodiment.

FIG. 7 is a circuit diagram illustrating a circuit configuration of a photosensor array according to the first embodiment. In the photosensor array according to this embodiment, the photosensor pixels PX1 to PX4 are arranged in a matrix. FIG. 7 illustrates only four photosensor pixels of PX1 to PX4, but in fact, for example, (100×150) photosensor pixels may be arranged.

Each of the photosensor pixels PX1 to PX4 is of a structure in which the n-type amorphous silicon film (n+a-Si) 23 doped with phosphorus and the amorphous silicon film (a-Si) 24 are held between the upper electrode 22 and the lower electrode 25. In FIG. 7, the photosensor pixels PX1 to PX4 are illustrated by the equivalent circuit illustrated in FIG. 2.

The cathodes of the diode parts D in each row of the photosensor pixels PX1 to PX4 are connected to any one of the plural scanning lines G1, G2, which corresponds to that row. The respective scanning lines G1, G2, are connected to the shift register 12. The shift register 12 sequentially applies the selection scanning voltage of Low level (hereinafter referred to as L level) to the scanning lines G1, G2, every one horizontal scanning period.

Also, the light-dependent variable resistance parts AS in each column of the photosensors PX1 to PX4 are connected to any one of the plural read lines S1, S2, which corresponds to that column. Each voltage change in the read lines S1, S2, in one horizontal scanning period is output from the bonding pad part 13 to the external signal processing circuit (not shown) as the signal voltage.

The shift register 12 is configured by a circuit mounted in the semiconductor chip, and arranged on a substrate where the photosensor array is fabricated. Alternatively, the shift register 12 is configured by a circuit including thin-film transistors in which a semiconductor layer is formed of a polysilicon layer on a photosensor array substrate such as a glass substrate. The respective reset transistors TLS are disposed between the read lines S1, S2, and a wire through which a reset voltage VRST is applied, and controlled according to a signal RG. Also, the stray capacitance Cs is developed between each read line and the external wire.

Figure 8:
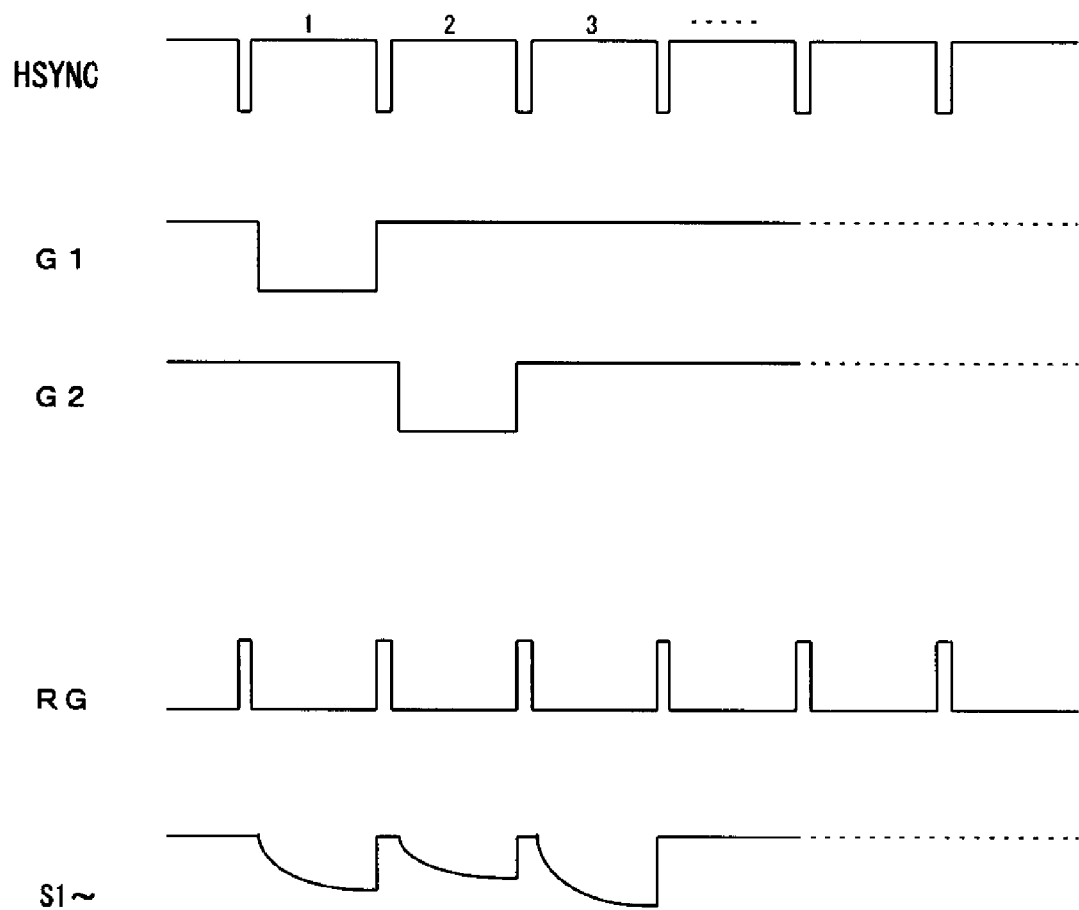
FIG. 8 is a timing chart illustrating a method of driving the photosensor array according to the first embodiment.

FIG. 8 is a timing chart illustrating a method of driving the photosensor array according to this embodiment. Hereinafter, the method of driving the photosensor array according to this embodiment will be described with reference to FIG. 8. In FIG. 7, the respective rows of the photosensor pixels are sequentially scanned downward by the shift register 12. That is, in FIG. 7, it is assumed that a voltage of L level is sequentially applied to gate lines G in the increasing order of number.

First, in a blanking period of one horizontal scanning period HSYNC, a signal RG becomes high level (hereinafter referred to as H level), and reset transistors TLS turn on. As a result, respective read lines S1, S2, are reset, and the respective read lines S1, S2, are uniformly set to a fixed potential (for example, 3V). In a period where the signal RG is H level, the respective scanning lines G1, G2, are H level (for example, 3V).

Then, when the signal RG becomes L level, the voltage of a scanning line G1 becomes low level (hereinafter referred to as L level, for example, ground potential of 0V), and the voltage of the other scanning levels becomes H level. As a result, the diode part D having cathodes connected to the scanning line G1 become on, and the diode parts D having cathodes connected to the scanning lines other than the scanning line G1 become off. Therefore, the photosensor pixels PX1 and PX2 become on, and the photosensor pixels PX3 and PX4 become off.

Light is input to the photosensor pixels PX1 and PX2, and the resistance value of the light-dependent variable resistance part AS of each photosensor pixel is changed according to the incident light. As a result, a current flowing from the respective read lines S1, S2, into the scanning line G1 is changed, and the potentials of the respective read lines S1, S2, (potentials held by stray capacitances Cs connected to the respective read lines) are decreased.

For example, when it is assumed that the photosensor pixel PX2 is irradiated with light, and the photosensor pixel PX1 is not irradiated with light, a dark current flows due to the resistance value of the light-dependent variable resistance part AS in the photosensor pixel PX1. Therefore the potential of the read line S1 is lowered to, for example, 2.5V. On the other hand, the resistance value of the light-dependent variable resistance part AS in the photosensor pixel PX2 that has been irradiated with light allows a current to be amplified by photoconduction. Therefore the potential of the read line S2 is lowered to, for example, 1.5V.

This voltage change is read as the signal voltages of the respective read lines S1, S2. A waveform of the read line S1~ in FIG. 8 shows the voltage change.

In this way, in this embodiment, in timing when the signal RG becomes H level, the potentials of the respective read lines S1, S2, are uniformly set to the fixed potential (for example, 3V), and thereafter the potentials of the respective read lines S1, S2, are fluctuated by the incident light (descent in FIG. 8).

After one horizontal scanning period HSYNC, before a subsequent signal RG becomes H level, an external signal processing circuit connected to the bonding pad part 13 takes in this signal voltage.

Thereafter, in the blanking period of one horizontal scanning period HSYNC, the signal RG becomes H level, and the reset transistors TLS turn on. As a result, the respective read lines S1, S2, are reset, and the respective read lines S1, S2, are uniformly set to the fixed potential (for example, 3V). Then, the voltage of the scanning line G2 becomes L level, and the voltage of the other scanning lines becomes H level.

As a result, the diode parts D having a cathode connected to the scanning line G2 becomes on, and the diode parts D having the cathodes connected to the scanning lines other than the scanning line G2 become off. Therefore, the photosensor pixels PX1 and PX2 become off, and the photosensor pixels PX3 and PX4 become on.

Light is input to the photosensor pixels PX3 and PX4, and the resistance value of the light-dependent variable resistance part AS is changed according to the incident light. As a result, a current flowing from the respective read lines S1, S2, into the scanning line G2 is changed, and the potentials of the respective read lines S1, S2, (potentials held by the stray capacitances Cs connected to the respective read lines) are decreased. This voltage change is read as the signal voltages of the respective read lines S1, S2. Hereinafter, the signal voltages are read in the same manner as that described above. The same processing is conducted on the scanning lines other than the scanning lines G1 and G2, and the signal voltages are taken in from the other photosensor pixels PX.

[Second Embodiment]

Figure 9:
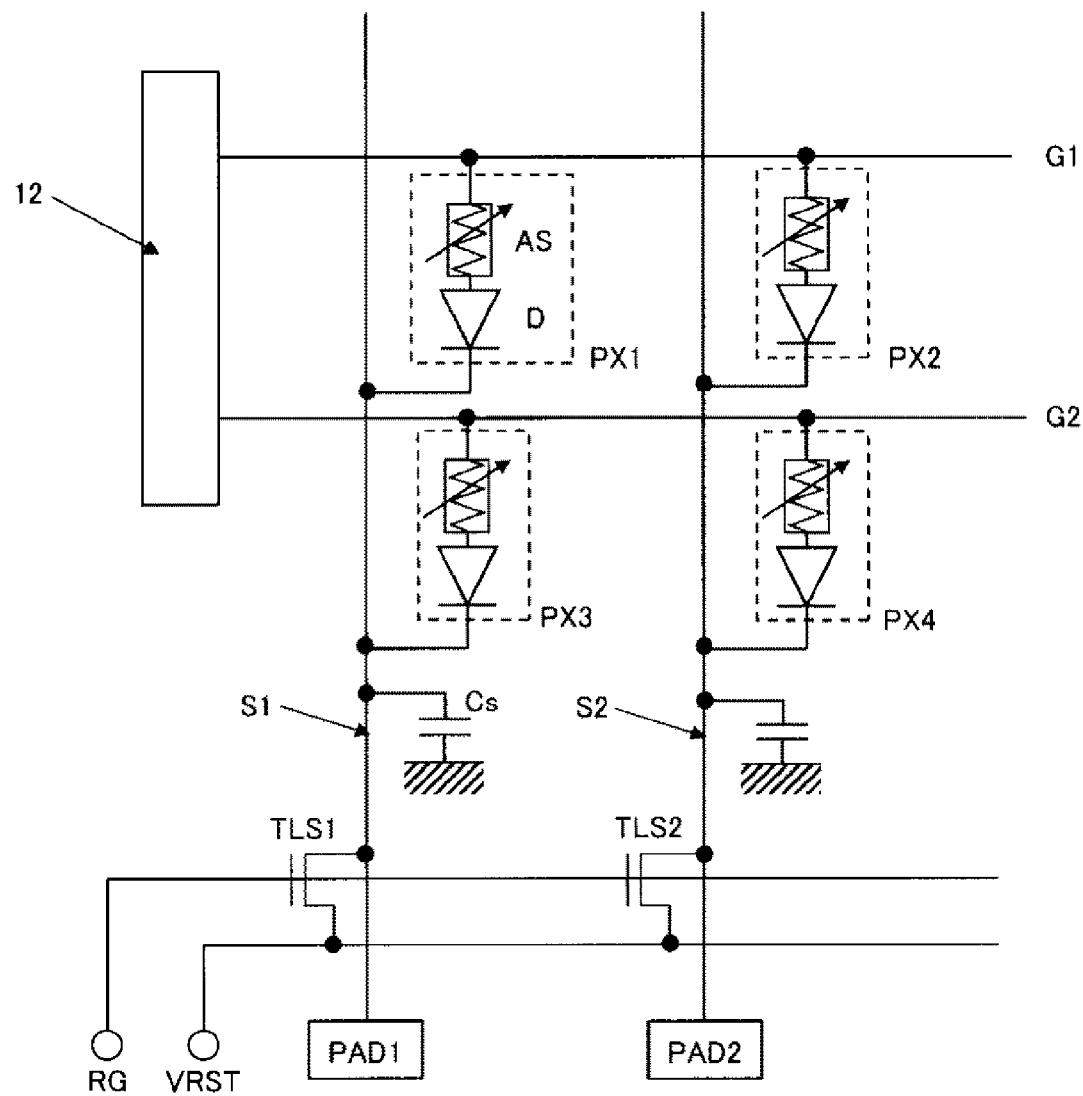
FIG. 9 is a circuit diagram illustrating a circuit configuration of a photosensor array according to a second embodiment.
Figure 10:
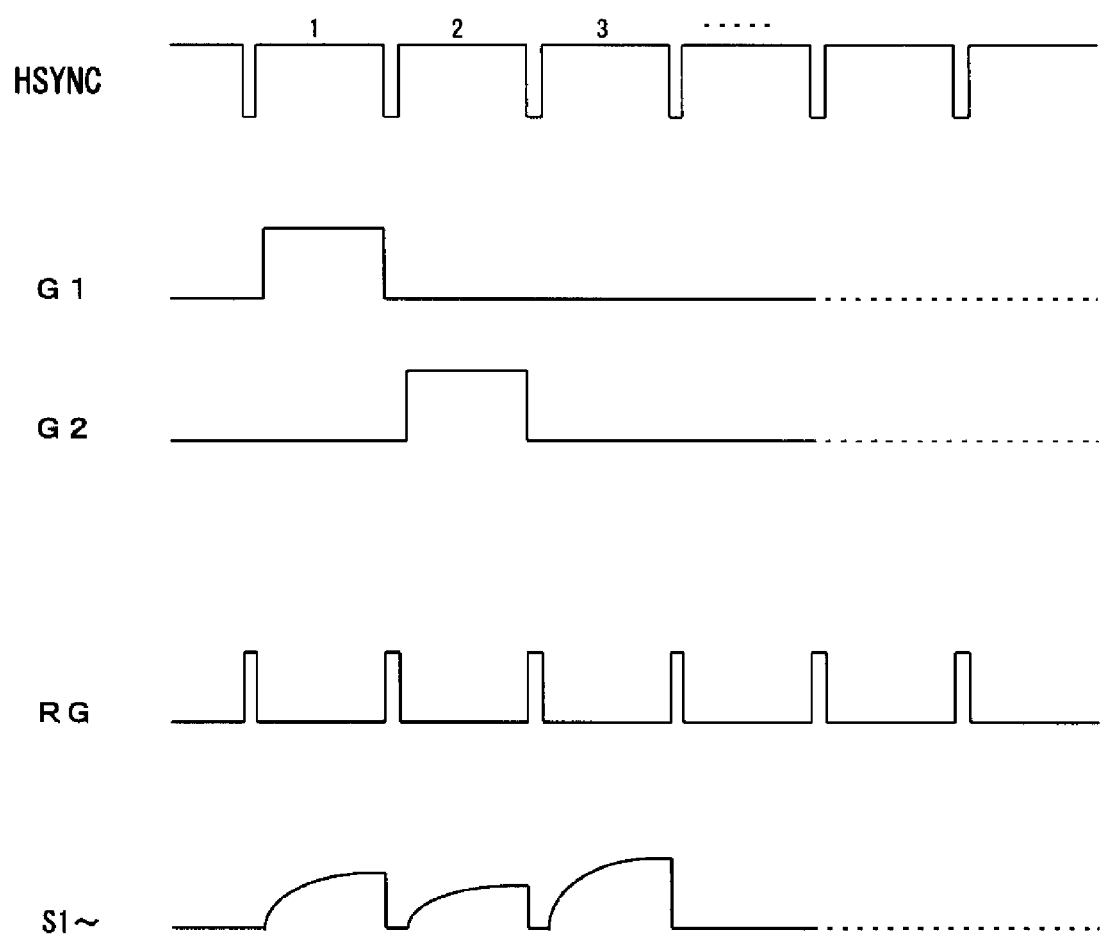
FIG. 10 is a timing chart illustrating the operation of the photosensor array according to the second embodiment.

FIG. 9 is a circuit diagram illustrating a circuit configuration of a photosensor array according to a second embodiment. FIG. 10 is a timing chart illustrating a method of driving the photosensor array according to the second embodiment.

This embodiment is mainly different from the above-described first embodiment in that the photosensor pixels are reversely connected. In this case, the polarities of the drive voltage and the signal voltage are also reverse. That is, in the method of driving the photosensor array according to this embodiment, when, in the blanking period of one horizontal scanning period HSYNC, the signal RG becomes H level, and the reset transistors TLS turn on, the respective read lines S1, S2, are uniformly set to aground potential.

Hereinafter, the method of driving the photosensor array according to this embodiment will be described with reference to FIG. 10.

First, in the blanking period of one horizontal scanning period HSYNC, the signal RG becomes H level, and the reset transistors TLS turn on. As a result, the respective read lines S1, S2, are reset, and the respective read lines S1, S2, are uniformly set to the fixed potential (for example, the ground potential of 0V). In a period where the signal RG is H level, the respective scanning lines G1, G2, become L level (for example, 0V).

Then, when the signal RG becomes L level, the voltage of the scanning line G1 becomes H level (for example, 3V), and the voltage of the other scanning lines becomes L level. As a result, the diode parts D having the anode connected to the scanning line G1 through the light-dependent variable resistance part AS become on, and the diode parts D having the anodes connected to the scanning lines other than the scanning line G1 through the light-dependent variable resistance parts AS become off. Therefore, the photosensor pixels PX1 an PX2 become on, and the photosensor pixels PX3 an PX4 become off.

Light is input to the photosensor pixels PX1 and PX2, and the resistance value of the light-dependent variable resistance part AS of the photosensor pixel is changed according to the incident light. As a result, a current flowing from the scanning line G1 into the read lines S1, S2, is changed, and the potentials of the respective read lines S1, S2, (potentials held by the stray capacitances Cs connected to the respective read lines) are increased.

For example, when it is assumed that the photosensor pixel PX2 is irradiated with light, and the photosensor pixel PX1 is not irradiated with light, a dark current flows due to the resistance value of the light-dependent variable resistance part AS in the photosensor pixel PX1. Therefore the potential of the read line S1 is increased to, for example, 0.5V. On the other hand, the resistance value of the light-dependent variable resistance part AS in the photosensor pixel PX2 which has been irradiated with light allows a current to be amplified by photoconduction. Therefore the potential of the read line S2 increases up to, for example, 1.5V. This voltage change is read as the signal voltages of the respective read lines S1, S2.

In this way, in this embodiment, after the potentials of the respective read lines S1, S2, are uniformly set to the fixed potential (for example, ground potential of 0V) in timing when the signal RG becomes H level, the potentials of the respective read lines S1, S2, are allowed to fluctuate (increase in FIG. 8) due to the incident light.

After one horizontal scanning period HSYNC, an external signal processing circuit connected to the bonding pad part 13 takes in this signal voltage.

Thereafter, in the blanking period of one horizontal scanning period HSYNC, the signal RG becomes H level, and the reset transistors TLS turn on. As a result, the respective read lines S1, S2, are reset, and the respective read lines S1, S2, are uniformly set to the fixed potential (for example, the ground potential of 0V). Then, the voltage of the scanning line G2 becomes H level, and the voltage other than the other scanning lines becomes L level.

With the above configuration, the diode parts D having the anode connected to the scanning line G2 through the light-dependent variable resistance part AS become on, and the diode parts D having the anodes connected to the scanning lines other than the scanning line G2 through the light-dependent variable resistance parts AS become off. Therefore, the photosensor pixels PX1 an PX2 become off, and the photosensor pixels PX3 an PX4 become on.

Light is input to the photosensor pixels PX3 and PX4, and the resistance value of the light-dependent variable resistance part AS of the photosensor pixel is changed according to the incident light. As a result, a current flowing from the scanning line G2 into the respective read lines S1, S2, is changed, and the potentials of the respective read lines S1, S2, are increased. The voltage change is read as the signal voltage of the respective read lines S1, S2. Subsequently, the signal voltage is read in the same manner as that described above. The same processing is conducted on the scanning lines other than the scanning lines G1 and G2, and the signal voltage is taken in.

[Third Embodiment]

In the photosensor arrays according to the above-described respective embodiments, a relatively large dark current component is always contained in the output signal voltage (or current). Also, because the dark current of amorphous silicon that is a high-resistant semiconductor has a temperature dependency, there is a need to correct the dark current component under the usage environment. The photosensor array according to this embodiment is configured to correct the dark current component.

Figure 11:
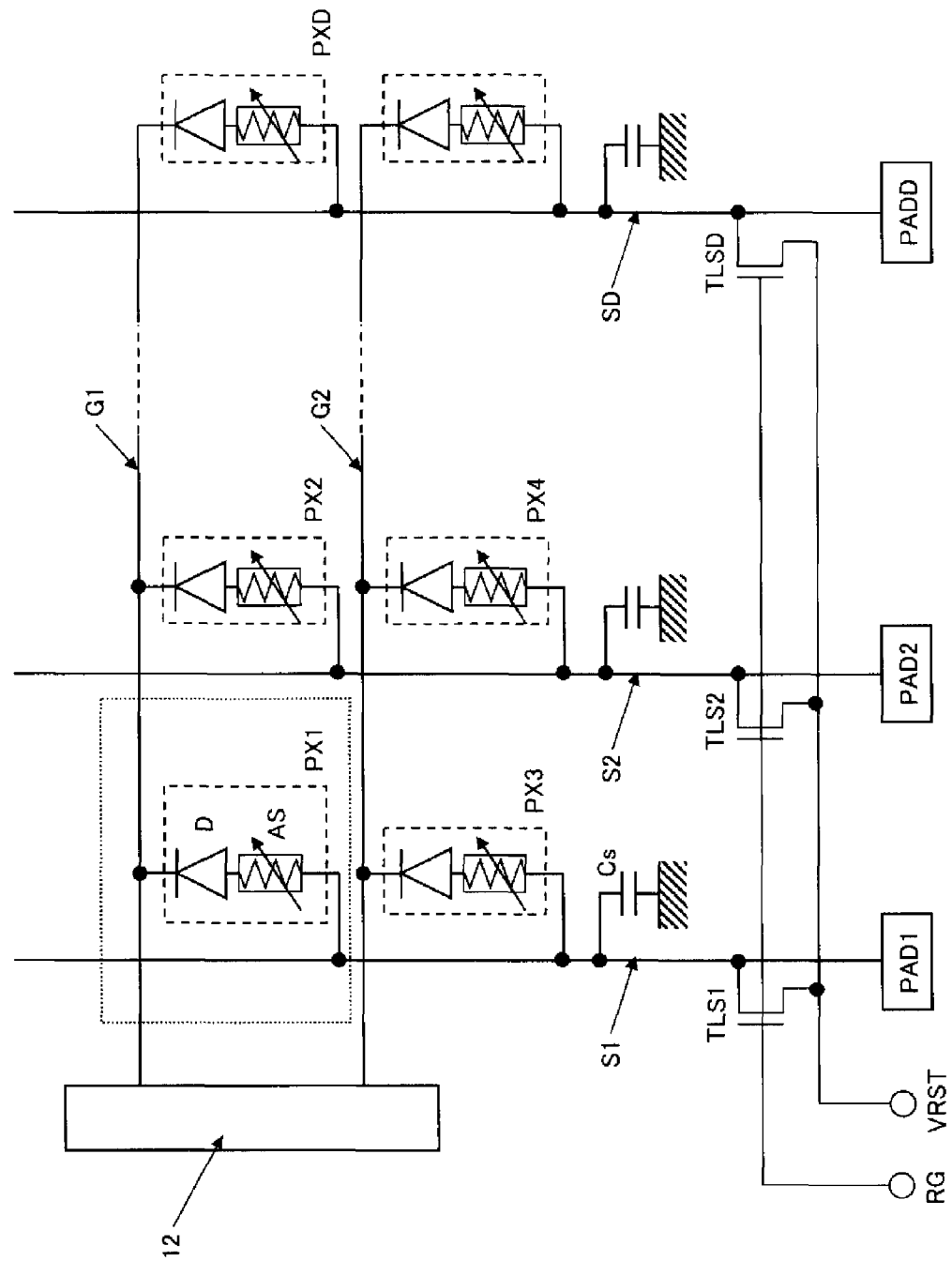
FIG. 11 is a circuit diagram illustrating a circuit configuration of a photosensor array according to a third embodiment.

FIG. 11 is a circuit diagram illustrating a circuit configuration of a photosensor array according to a third embodiment.

A difference between this embodiment and the first embodiment mainly resides in that a photosensor pixel PXD for dark current correction is disposed on each row of the photosensor array. The photosensor pixel PXD for dark current correction may be disposed in the photosensor array of the second embodiment.

In an example illustrated in FIG. 11, one photosensor PXD for dark current correction is disposed on each row of the photosensor array. As a result, the photosensors PXD for dark current correction on one column are disposed at an opposite end of the shift register 12 in the photosensor array.

A cross-section structure of the photosensors PXD for dark current correction is identical with the cross-section structure illustrated in FIG. 1. A light blocking film is disposed on each of the photosensors PXD for dark current correction so as to prevent light incidence. Also, a method of driving the photosensor array in this embodiment is identical with that in FIG. 8, but a signal voltage of the photosensor PXD for dark current correction is output from the read line SD for dark current correction.

In the photosensor array according to this embodiment, a dark state is produced under the usage environment, and a process of subtracting this voltage from an output during light irradiation is executed by the external signal processing circuit, and the dark current component is corrected.

Figure 12:
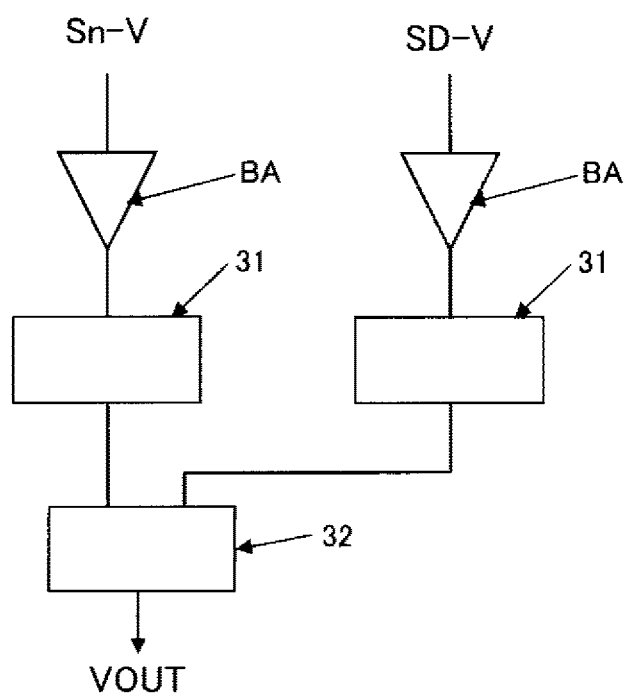
FIG. 12 is a block diagram illustrating an example of a signal processing circuit that corrects a dark current component.
Figure 13:
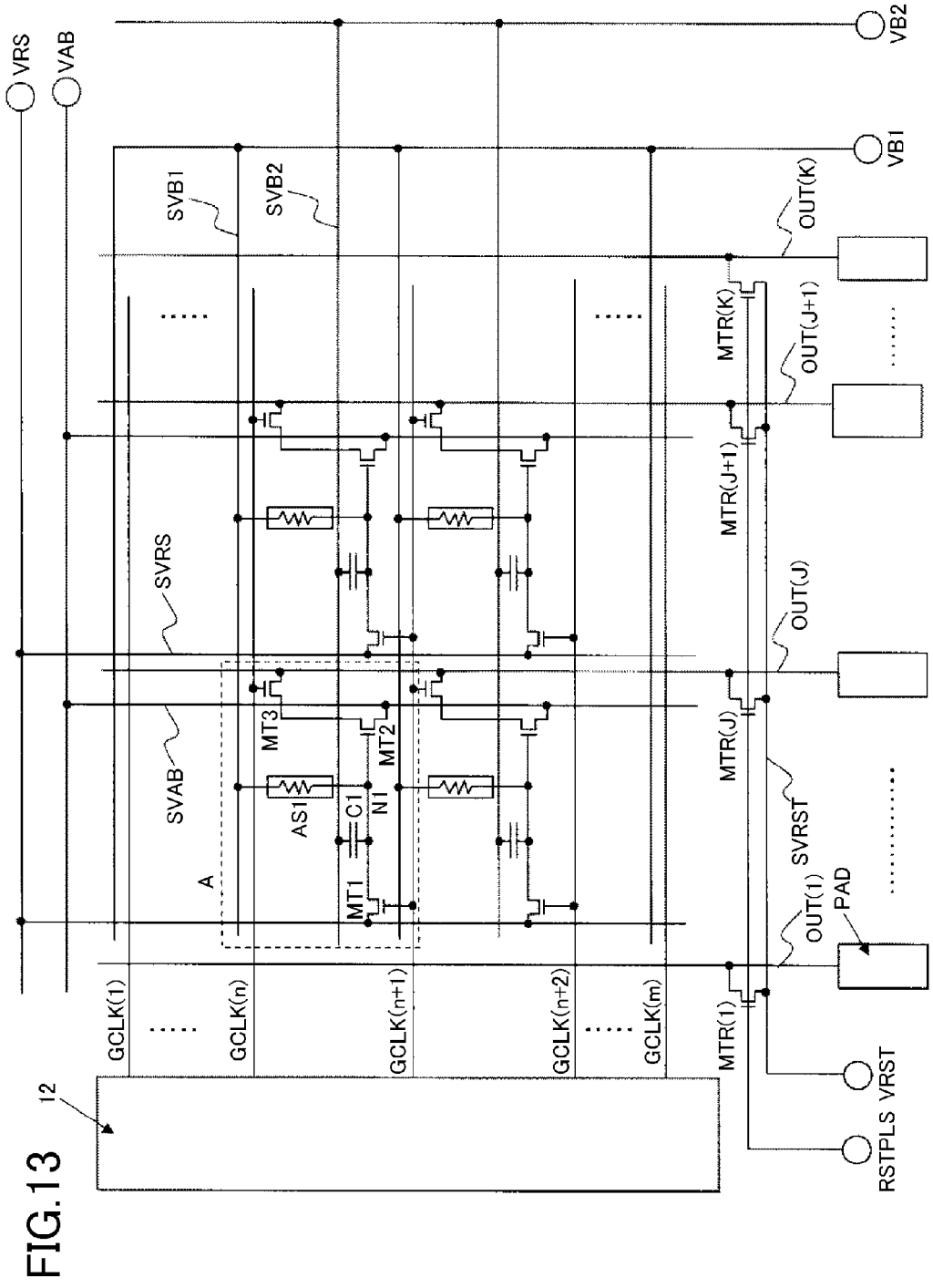
FIG. 13 is a circuit diagram illustrating a circuit configuration of a photosensor array according to the invention in Japanese Patent Application that has been already filed in Japanese Patent Office.
Figure 14:
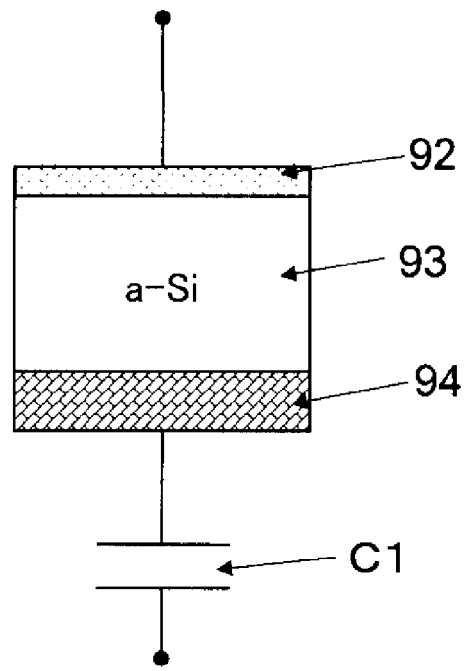
FIG. 14 is a diagram illustrating a configuration of a light-dependent variable resistance element in a photosensor illustrated in FIG. 13.
Figure 15:
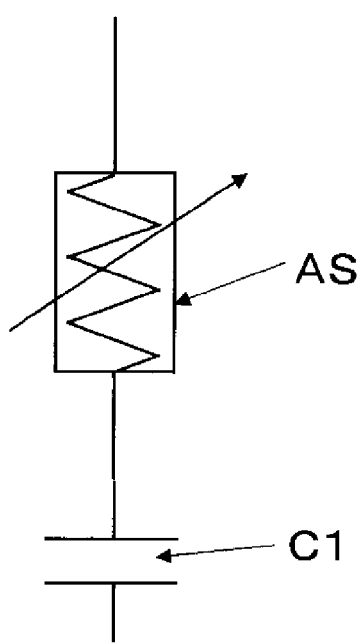
FIG. 15 is a circuit diagram illustrating an equivalent circuit of the light-dependent variable resistance element ASI illustrated in FIG. 13.
Figure 16:
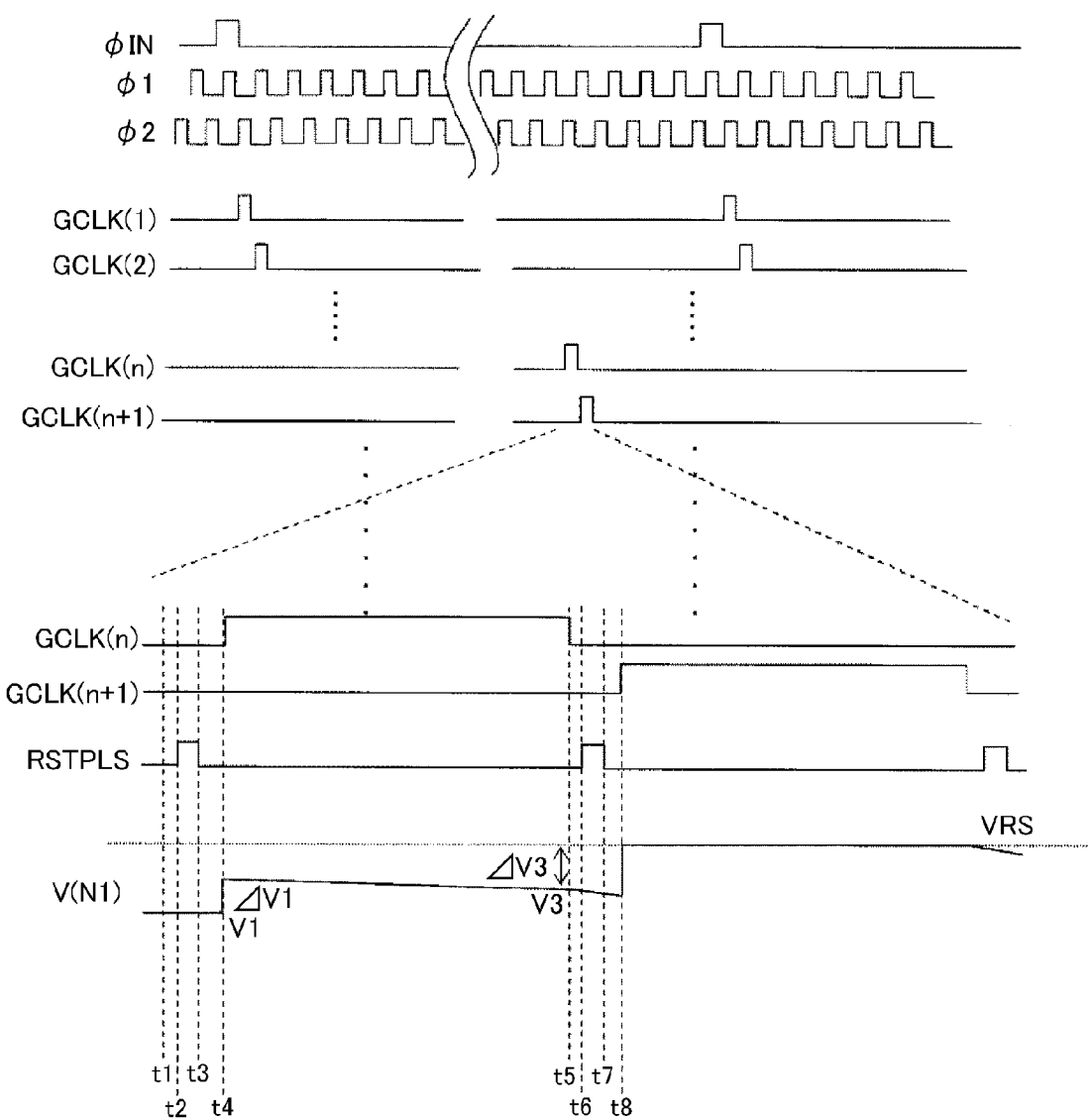
FIG. 16 is a timing chart illustrating the operation of the photosensor array illustrated in FIG. 13.

FIG. 12 is a block diagram illustrating an example of an external signal processing circuit that corrects a dark current component.

The signal processing circuit illustrated in FIG. 12 inputs the signal voltages (Sn-V) of the photosensor pixels on each row, which are read from the respective read lines S1, S2, in the photosensor array, and the signal voltages (SD-V) of the photosensor pixels PXD, which are read from the read line SD for dark current correction, to an A/D converter 31 through a buffer circuit BA, and converts the input voltages into digital signals. Thereafter, a subtractor 32 subtracts the digital signal voltage of the photosensor pixel PXD for dark current correction from the digital signal voltage of the photosensor pixel for each row to correct the dark current component.

In the above respective embodiments, the signal processing circuit is not required to be externally provided, but may be mounted in a semiconductor chip, and arranged on a substrate where the photosensor array is fabricated as with the shift register 12 illustrated in FIG. 6. Alternatively, the signal processing circuit may be configured by forming a circuit including thin-film transistors in which a semiconductor layer is formed of a polysilicon layer on a photosensor array substrate such as a glass substrate.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A photosensor including a lower electrode formed of a metal film, an amorphous silicon film disposed on the lower electrode, an n-type amorphous silicon film disposed on the amorphous silicon film, and an upper electrode disposed on the n-type amorphous silicon film, in which the photosensor outputs a voltage depending on the amount of light input to the amorphous silicon film as a sensor output voltage, the photosensor comprising:
   a unit that inputs a first voltage to the upper electrode;
   a unit that inputs a second voltage higher in potential than the first voltage to the lower electrode in an on-state, and puts the lower electrode into a floating state in an off-state; and
   a unit that outputs a voltage change of the lower electrode after a given period has been elapsed, as the sensor output voltage, when the lower electrode is in the floating state;
   wherein the lower electrode is directly coupled to a read line connected to an output pad.

2. The photosensor according to claim 1, wherein a thickness of the amorphous silicon film of each of the photosensor pixels is 500 nm or higher.

3. The photosensor according to claim 2, wherein a thickness of the amorphous silicon film of each of the photosensor pixels is 1200 nm or lower.

4. A photosensor array including an array of (m×n) photosensor pixels, each including a lower electrode formed of a metal film, an amorphous silicon film disposed on the lower electrode, an n-type amorphous silicon film disposed on the amorphous silicon film, and an upper electrode disposed on the n-type amorphous silicon film, in which each of the photosensor pixels outputs a voltage corresponding to the amount of light input to the amorphous silicon film,
   the photosensor array comprising:
   a plurality of scanning lines directly connected to the upper electrodes included in the photosensor pixels on each row;
   a plurality of read lines directly connected to the lower electrodes included in the photosensor pixels on each column and extending in a direction where the photosensor pixels on each column are aligned;
   a scanning circuit that is connected to the plurality of scanning lines, and sequentially supplies a selection scanning signal of a first voltage to the respective scanning lines every one horizontal scanning period;
   a first unit that inputs a second voltage higher in potential than the first voltage to the plurality of read lines in a blanking period of one horizontal scanning period, and thereafter puts the plurality of read lines into the floating state; and
   a second unit that is connected to the plurality of read lines, and outputs a voltage change in each of the read lines within one horizontal scanning period as the sensor output voltage of the photosensor pixel having the lower electrode connected to each of the read lines and the upper electrode receiving the selection scanning voltage.

5. A photosensor array including an array of (m×n) photosensor pixels, each including a lower electrode formed of a metal film, an amorphous silicon film disposed on the lower electrode, an n-type amorphous silicon film disposed on the amorphous silicon film, and an upper electrode disposed on the n-type amorphous silicon film, and (m×1) compensation photosensor pixels, each including a lower electrode formed of a metal film, an amorphous silicon film disposed on the lower electrode, the amorphous silicon film blocked from light, an n-type amorphous silicon film disposed on the amorphous silicon film, and an upper electrode disposed on the n-type amorphous silicon film, in which each of the photosensor pixels outputs a voltage corresponding to the amount of light input to the amorphous silicon film,
   the photosensor array comprising:
   a plurality of scanning lines directly connected to the upper electrodes included in the photosensor pixels and the compensation photosensor pixel on each row;
   a plurality of read lines directly connected to the lower electrodes of the photosensor pixels on each column and extending in a direction where the photosensor pixels on each column are aligned;

a compensation pixel read line connected to the lower electrodes of the (m×1) compensation photosensor pixels;

a scanning circuit that is connected to the plurality of scanning lines, and sequentially supplies a selection scanning signal of a first voltage to the respective scanning lines every one horizontal scanning period;

a first unit that inputs a second voltage higher in potential than the first voltage to the plurality of read lines and the compensation pixel read line in a blanking period of one horizontal scanning period, and thereafter puts the plurality of read lines and the compensation pixel read line into the floating state;

a second unit that is connected to the plurality of read lines, and outputs a voltage change in each of the read lines within one horizontal scanning period as the sensor output voltage of the photosensor pixel having the lower electrode connected to each of the read lines and the upper electrode receiving the selection scanning voltage; and a third unit that is connected to the compensation pixel read line, and outputs a voltage change in the compensation pixel read line within the horizontal scanning period as a compensation signal voltage of the compensation photosensor pixel having the upper electrode receiving the selection scanning voltage.

6. The photosensor array according to claim 5, further comprising: a signal processing circuit that receives the respective sensor output voltages and the compensation signal voltages, wherein the signal processing circuit includes:

an A/D converter that subjects the respective sensor output voltages and the compensation signal voltages to A/D conversion; and a subtractor that subtracts a digital value of the compensation signal voltage converted by the A/D converter from a digital value of the respective sensor output voltages converted by the A/D converter.

7. The photosensor array according to claim 5, wherein the first unit includes a plurality of switching transistors disposed for each of the plurality of read lines and the compensation pixel read line, and the plurality of switching transistors are on within a blanking period of the one horizontal scanning period, and input the second voltage to the plurality of read lines and the compensation pixel read line.

8. The photosensor array according to claim 5, wherein a thickness of the amorphous silicon film of each of the photosensor pixels is 500 nm or higher.

9. The photosensor array according to claim 8, wherein a thickness of the amorphous silicon film of each of the photosensor pixels is 1200 nm or lower.

10. The photosensor according to claim 1, wherein the lower electrode is directly coupled to the read line without a switching element.

11. The photosensor according to claim 4, wherein the plurality of read lines are directly connected to the lower electrodes without switching elements.

12. The photosensor according to claim 5, wherein the plurality of read lines are directly connected to the lower electrodes without switching elements.

* * * * *